United States Patent
Suzuki

(10) Patent No.: US 8,368,131 B2
(45) Date of Patent: Feb. 5, 2013

(54) LIGHT DETECTING APPARATUS

(75) Inventor: Takashi Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 82 days.

(21) Appl. No.: 12/888,739

(22) Filed: Sep. 23, 2010

(65) Prior Publication Data

US 2011/0073980 A1   Mar. 31, 2011

(30) Foreign Application Priority Data

Sep. 25, 2009 (JP) ................... 2009-221037

(51) Int. Cl.
*H01L 31/062* (2012.01)
(52) U.S. Cl. ...................................... 257/293
(58) Field of Classification Search .......... 257/444, 257/448, 459, 466, 114, 233, 293, E33.076
See application file for complete search history.

(56) References Cited

U.S. PATENT DOCUMENTS 5,589,705 A * 12/1996 Saito et al. .................... 257/459

FOREIGN PATENT DOCUMENTS

JP       2-263123      10/1990

* cited by examiner

*Primary Examiner* — Quoc Hoang
(74) *Attorney, Agent, or Firm* — Drinker Biddle & Reath LLP

(57) ABSTRACT

A light detecting apparatus is provided with a semiconductor substrate, a first electrode layer, and a second electrode layer. The semiconductor substrate has a first conductivity type first semiconductor region, and a second conductivity type second semiconductor region formed on the first semiconductor region and constituting a photodiode based on a pn junction formed between the first semiconductor region and the second semiconductor region. The first electrode layer is arranged above the second semiconductor region so as to be opposed to the second semiconductor region and is electrically connected to the second semiconductor region. The second electrode layer is arranged above the first electrode layer so as to be opposed to the first electrode layer and forms a capacitance component connected to the photodiode, between the first electrode layer and the second electrode layer.

7 Claims, 15 Drawing Sheets

LIGHT DETECTING APPARATUS

BACKGROUND OF THE INVENTION

1. Field of the Invention

The present invention relates to a light detecting apparatus.

2. Related Background Art

There is a known light detecting apparatus wherein an output of a light receiving element is connected through a coupling capacitor to an amplifier circuit (e.g., cf. Japanese Patent Application Laid-open No. 2-263123). In the light detecting apparatus described in the foregoing Laid-open No. 2-263123, the impedance can be made smaller on the light receiving element side and the equivalent input noise level can be reduced, so as to improve C/N ratios.

SUMMARY OF THE INVENTION

With the light detecting apparatus described in the Laid-open No. 2-263123, nothing is taken into consideration as to particulars of specific arrangement or formation of the coupling capacitor. For example, in a case where a chip capacitor or the like is adopted as the coupling capacitor and where individual components such as the light receiving element and chip capacitor are mounted on a printed circuit board, a parasitic capacitance is generated in each of the components and wires on the printed circuit board. For this reason, noise and high-frequency characteristics degrade.

An object of the present invention is to provide a light detecting apparatus with excellent noise and high-frequency characteristics, while suppressing generation of the parasitic capacitance.

A light detecting apparatus according to the present invention comprises: a semiconductor substrate having a first conductivity type first semiconductor region, and a second conductivity type second semiconductor region formed on the first semiconductor region and constituting a photodiode based on a pn junction formed between the first semiconductor region and the second semiconductor region; a first electrode layer arranged above the second semiconductor region so as to be opposed to the second semiconductor region, and electrically connected to the second semiconductor region; and a second electrode layer arranged above the first electrode layer so as to be opposed to the first electrode layer, and forming a capacitance component connected to the photodiode, between the first electrode layer and the second electrode layer.

In the light detecting apparatus according to the present invention, the capacitance component is formed between the first electrode layer arranged above the second semiconductor region and the second electrode layer arranged above the first electrode layer so as to be opposed to the first electrode layer. The capacitance component thus formed functions as a coupling capacitor connected in series to the photodiode. Since the capacitance component functioning as a coupling capacitor is directly formed on the semiconductor substrate in the present invention as described above, the parasitic capacitance generated is smaller in the apparatus of the present invention than in the aforementioned configuration wherein the individual components are mounted on the board.

It is also conceivable to form a pair of electrode layers opposed to each other, above a region except for the second semiconductor region, e.g., above the first semiconductor region, as a configuration wherein the capacitance component functioning as a coupling capacitor is directly formed on the semiconductor substrate. In this configuration, however, a parasitic capacitance is generated between the first semiconductor region and the electrode layer opposed to the first semiconductor region. This parasitic capacitance is connected in parallel to a junction capacitance formed between the first semiconductor region and the second semiconductor region constituting the photodiode. For this reason, it can lead to increase in noise and reduction in S/N ratios. Furthermore, it can deteriorate the high-frequency characteristic.

In the present invention, since the first electrode layer is arranged above the second semiconductor region, a parasitic capacitance is generated between the first electrode layer and the second semiconductor region. However, the first electrode layer and the second semiconductor region are electrically connected to each other, and therefore a potential difference is unlikely to be made between the first electrode layer and the second semiconductor region. Consequently, the parasitic capacitance between the first electrode layer and the second semiconductor region is extremely small.

According to the present invention, as described above, it is feasible to realize the light detecting apparatus with excellent noise and high-frequency characteristics, while suppressing generation of the parasitic capacitance.

The light detecting apparatus may be configured as follows: the semiconductor substrate includes first and second principal surfaces opposed to each other; the second semiconductor region is formed on the second principal surface side of the semiconductor substrate; the light detecting apparatus further comprises a device arranged relative to the second principal surface of the semiconductor substrate and provided with amplifying means; the second electrode layer and an input terminal of the amplifying means are electrically connected to each other through a bump. In this case, the first principal surface of the semiconductor substrate can serve as a light entrance surface and various electrodes do not impede incidence of light to the photodiode. Since the semiconductor substrate with the first and second electrode layers formed thereon is connected to the device through the bump, external noise is less likely to be mixed into the apparatus than in a configuration wherein they are connected by a technique such as wire bonding. As a consequence, it is feasible to suppress degradation of the noise characteristic.

The second electrode layer may be directly connected as a connection electrode to the bump. In this case, the second electrode layer is used in common as an electrode for constitution of the capacitance component and as an electrode for connection to the device, which can simplify the configuration.

The light detecting apparatus may further comprise a connection electrode electrically connected to the second electrode layer, and the connection electrode and the bump may be directly connected to each other. In this case, since the light detecting apparatus has the electrode for constitution of the capacitance component and the electrode for connection to the device, the second electrode layer and the connection electrode can be designed according to requirements suitable for the respective electrodes.

The present invention permits the light detecting apparatus to further comprise: a third electrode layer arranged above the first semiconductor region so as to be opposed to the first semiconductor region, and electrically connected to the first semiconductor region; and a fourth electrode layer arranged above the third electrode layer so as to be opposed to the third electrode layer, and forming a capacitance component connected to the photodiode, between the third electrode layer and the fourth electrode layer.

In this case, since the third electrode layer is arranged above the first semiconductor region, a parasitic capacitance is generated between the third electrode layer and the first semiconductor region. However, the third electrode layer and the first semiconductor region are electrically connected to each other and therefore a potential difference is unlikely to be made between the third electrode layer and the first semiconductor region. Consequently, the parasitic capacitance between the third electrode layer and the first semiconductor region is extremely small.

The light detecting apparatus may be configured as follows: the semiconductor substrate includes first and second principal surfaces opposed to each other; the second semiconductor region is formed on the second principal surface side of the semiconductor substrate; the light detecting apparatus further comprises a device arranged relative to the second principal surface of the semiconductor substrate and provided with amplifying means; the second and fourth electrode layers are electrically connected to respective input terminals of the amplifying means through respective bumps. In this case, the first principal surface of the semiconductor substrate can serve as a light entrance surface and various electrodes do not impede incidence of light to the photodiode. Since the semiconductor substrate with the first to fourth electrode layers formed thereon is connected to the device through the bumps, external noise is less likely to be mixed into the apparatus than in the configuration wherein they are connected by a technique such as wire bonding. As a result, it is feasible to suppress degradation of the noise characteristic.

The fourth electrode layer may be directly connected as a connection electrode to the bump. In this case, the fourth electrode layer is used in common as an electrode for constitution of the capacitance component and an electrode for connection to the device, which can simplify the configuration.

The light detecting apparatus may further comprise a connection electrode electrically connected to the fourth electrode layer, and the connection electrode and the bump may be directly connected to each other. In this case, the light detecting apparatus has the electrode for constitution of the capacitance component and the electrode for connection to the device, and therefore the fourth electrode layer and the connection electrode can be designed according to requirements suitable for the respective electrodes.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, identical elements or elements with identical functionality will be denoted by the same reference signs, without redundant description.

Figure 1:
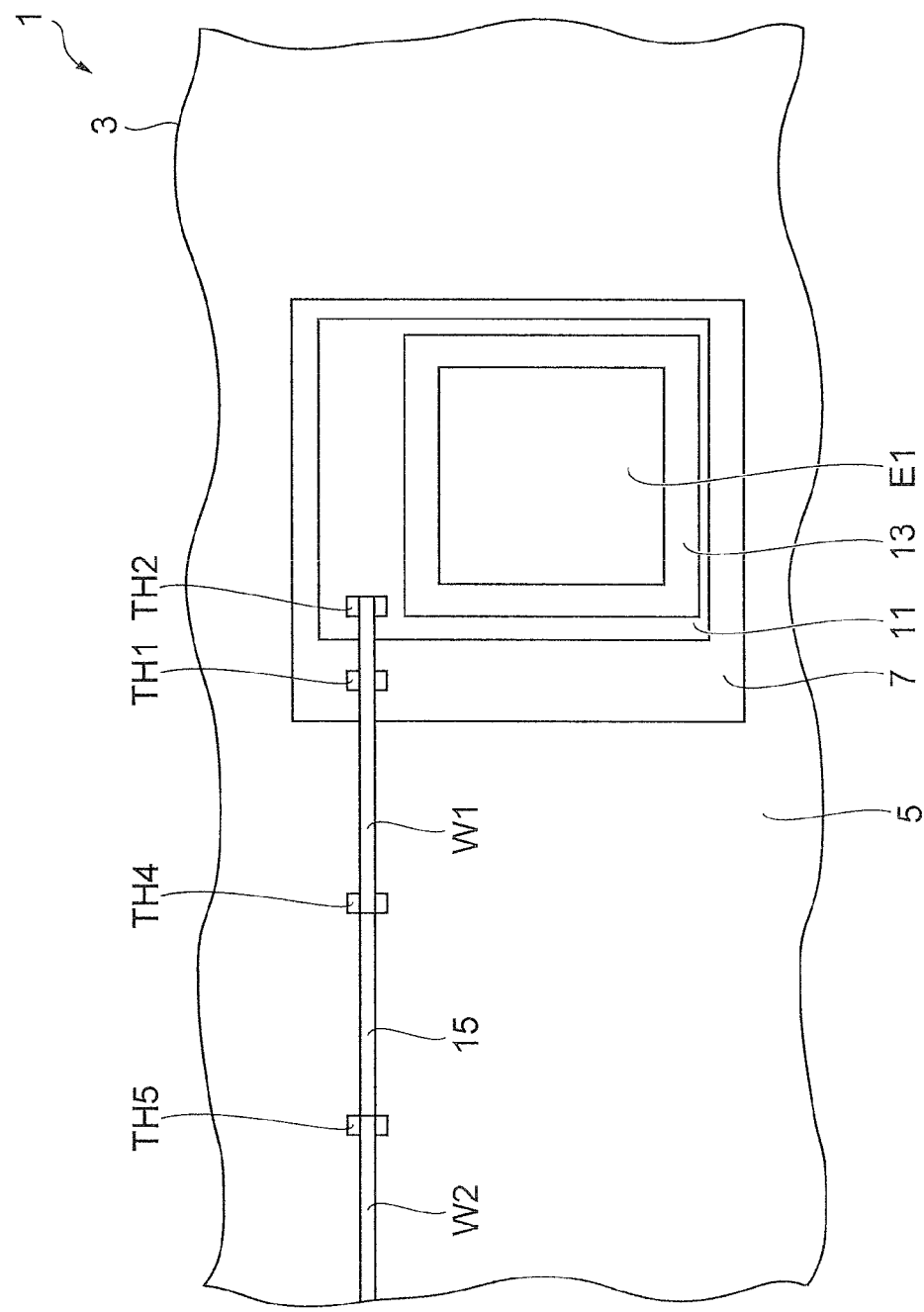
FIG. 1 is a schematic plan view showing a light detecting apparatus according to an embodiment of the present invention.
Figure 2:
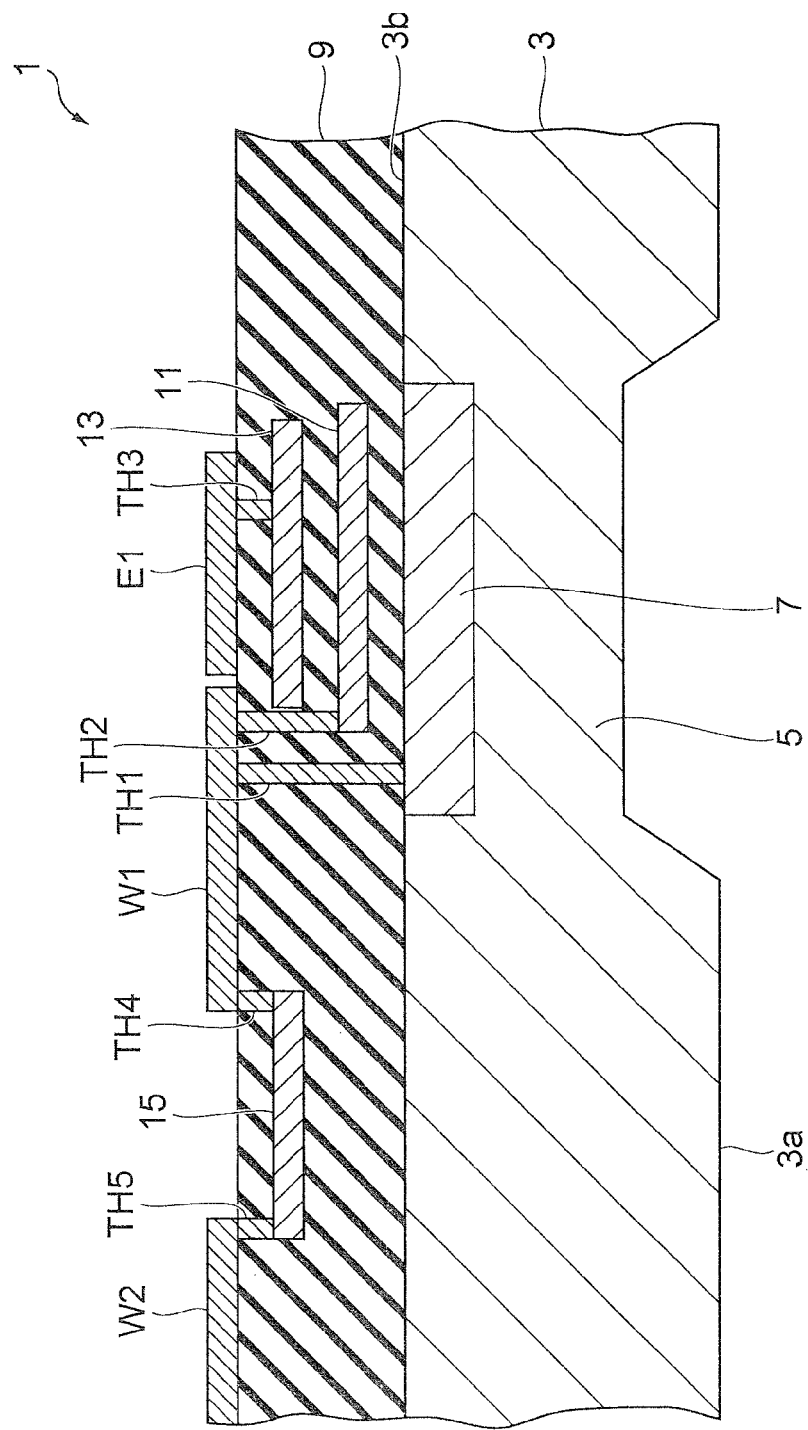
FIG. 2 is a drawing for explaining a cross-sectional configuration of the light detecting apparatus according to the embodiment.
Figure 3:
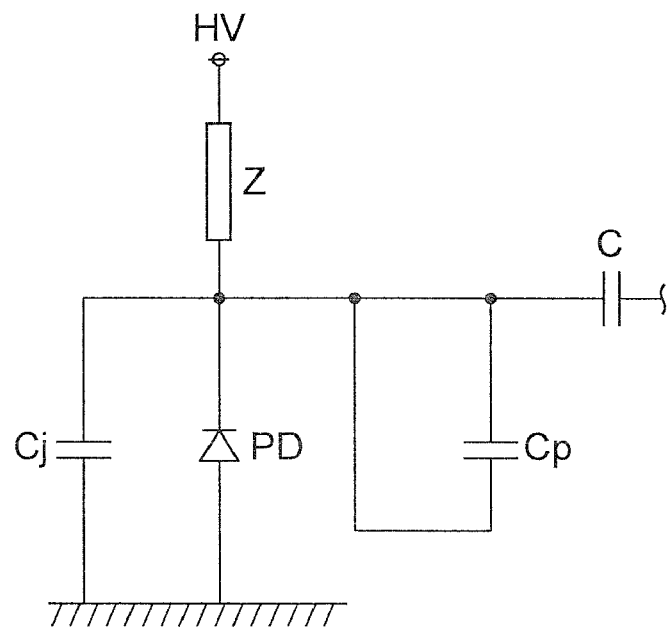
FIG. 3 is a circuit diagram showing an equivalent circuit of the light detecting apparatus according to the embodiment.

A light detecting apparatus 1 according to an embodiment of the present invention will be described with reference to FIGS. 1 to 3. FIG. 1 is a schematic plan view showing the light detecting apparatus according to the present embodiment. FIG. 2 is a drawing for explaining a cross-sectional configuration of the light detecting apparatus according to the present embodiment. FIG. 3 is a circuit diagram showing an equivalent circuit of the light detecting apparatus according to the present embodiment. In FIG. 1 the apparatus is depicted without illustration of insulating layer 9 described later.

The light detecting apparatus 1, as shown in FIGS. 1 and 2, is provided with a semiconductor substrate 3. The semiconductor substrate 3 is comprised of crystalline silicon (Si) and includes first and second principal surfaces 3a, 3b opposed to each other. The first principal surface 3a of the semiconductor substrate 3 serves as a light entrance surface.

The semiconductor substrate 3 has a p-type first semiconductor region 5, and an $n^+$-type second semiconductor region 7 formed on the first semiconductor region 5. A pn junction is formed between the first semiconductor region 5 and the second semiconductor region 7 and this pn junction constitutes a photodiode. In the present embodiment, the second semiconductor region 7 is formed on the second principal surface 3b side of the semiconductor substrate 3. The second semiconductor region 7 has a rectangular shape on the plan view. The plane size of the second semiconductor region 7 is, for example, 0.15 mm×0.15 mm.

The semiconductor substrate 3 can be obtained by preparing a p-type semiconductor substrate and diffusing an n-type impurity (e.g., phosphorus (P), antimony (Sb), arsenic (As), or the like) from the second principal surface 3b side into the p-type semiconductor substrate to form the second semiconductor region. In the present embodiment, the sign "+" attached to conductivity type indicates "high impurity concentration." In contrast, "low impurity concentration" is indicated by the sign "−" attached to conductivity type.

The thickness/impurity concentration of each of the semiconductor regions are as follows.
First semiconductor region 5: thickness 10 to 1000 μm/impurity concentration $1\times10^{12}$ to $10^{15}$ cm$^{-3}$;
Second semiconductor region 7: thickness 0.1 to 10 μm/impurity concentration $1\times10^{13}$ to $10^{21}$ cm$^{-3}$.

The semiconductor substrate 3 is thinned in a portion corresponding to the second semiconductor region 7 from the first principal surface 3a side, while leaving a peripheral portion around the corresponding portion. The corresponding portion is thinned by anisotropic etching such as alkali etching using, for example, a potassium hydroxide solution, TMAH (tetramethylammonium hydroxide solution), or the like. The thickness of the portion corresponding to the second semiconductor region 7 in the semiconductor substrate 3 is, for example, approximately 30 μm. The semiconductor substrate 3 may be thinned in all of the substrate from the first principal surface 3a side so that the thickness becomes the desired value.

An insulating layer 9 is formed on the second principal surface 3b of the semiconductor substrate 3. The insulating layer 9 is comprised, for example, of an insulating material such as polyimide resin or silicon dioxide ($SiO_2$). A first electrode layer 11, a second electrode layer 13, and a resistor 15 are arranged in the insulating layer 9.

The first electrode layer 11 is arranged above the second semiconductor region 7 so as to be opposed to the second semiconductor region 7 through the insulating layer 9. The first electrode layer 11 has a rectangular shape on the plan view. The plane size of the first electrode layer 11 is, for example, 0.12 mm×0.12 mm. The first electrode layer 11 is wholly superimposed on the second semiconductor region 7 when viewed from the direction perpendicular to the second principal surface 3b of the semiconductor substrate 3. The first electrode layer 11 is comprised, for example, of polysilicon.

The first electrode layer 11 is electrically connected to the second semiconductor region 7 through through-holes TH1, TH2 formed in the insulating layer 9 and through a wire W1 formed on the insulating layer 9. The through-holes TH1, TH2 are comprised, for example, of aluminum (Al). The wire W1 is comprised, for example, of metal such as aluminum.

The second electrode layer 13 is arranged above the first electrode layer 11 so as to be opposed to the first electrode layer 11 through the insulating layer 9. The second electrode layer 13 has a rectangular shape on the plan view. The plane size of the second electrode layer 13 is, for example, 0.11 mm×0.11 mm. The second electrode layer 13 is wholly superimposed on the first electrode layer 11 when viewed from the direction perpendicular to the second principal surface 3b of the semiconductor substrate 3. The second electrode layer 13 is comprised, for example, of polysilicon.

The second electrode layer 13 is electrically connected to a connection electrode E1 formed on the insulating layer 9, through a through-hole TH3 formed in the insulating layer 9. The through-hole TH3 is comprised, for example, of aluminum (Al). The connection electrode E1 has a rectangular shape on the plan view and its plane size is, for example, 0.1 mm×0.1 mm. The connection electrode E1 is comprised, for example, of metal such as aluminum.

The resistor 15 is electrically connected at its one end to the wire W1 through a through-hole TH4 formed in the insulating layer 9. The other end of the resistor 15 is electrically connected to a wire W2 formed on the insulating layer 9, through a through-hole TH5 formed in the insulating layer 9.

Since the first electrode layer 11 and the second electrode layer 13 are opposed to each other through the insulating layer 9, a capacitance component C is formed between the first electrode layer 11 and the second electrode layer 13, as shown in FIG. 3. The capacitance component C is connected to the cathode of the photodiode PD composed of the pn junction between the first semiconductor region 5 and the second semiconductor region 7 and functions as a coupling capacitor connected in series to the photodiode PD. The cathode of the photodiode PD is given a reverse bias potential through a resistive component Z composed of the resistor 15. The first semiconductor region 5 is given the ground potential through a back gate or a through-electrode, whereby the anode of the photodiode PD is grounded. A junction capacitance Cj is created between the first semiconductor region 5 and the second semiconductor region 7. This junction capacitance Cj is connected in parallel to the photodiode PD.

Since the second semiconductor region 7 and the first electrode layer 11 are opposed to each other through the insulating layer 9, a parasitic capacitance Cp is generated between the second semiconductor region 7 and the first electrode layer 11. However, the second semiconductor region 7 and the first electrode layer 11 are electrically connected through the through-holes TH1, TH2 and the wire W1 and therefore a potential difference is unlikely to be made between the second semiconductor region 7 and the first electrode layer 11. Consequently, the parasitic capacitance Cp is extremely small and substantially zero.

Figure 4:
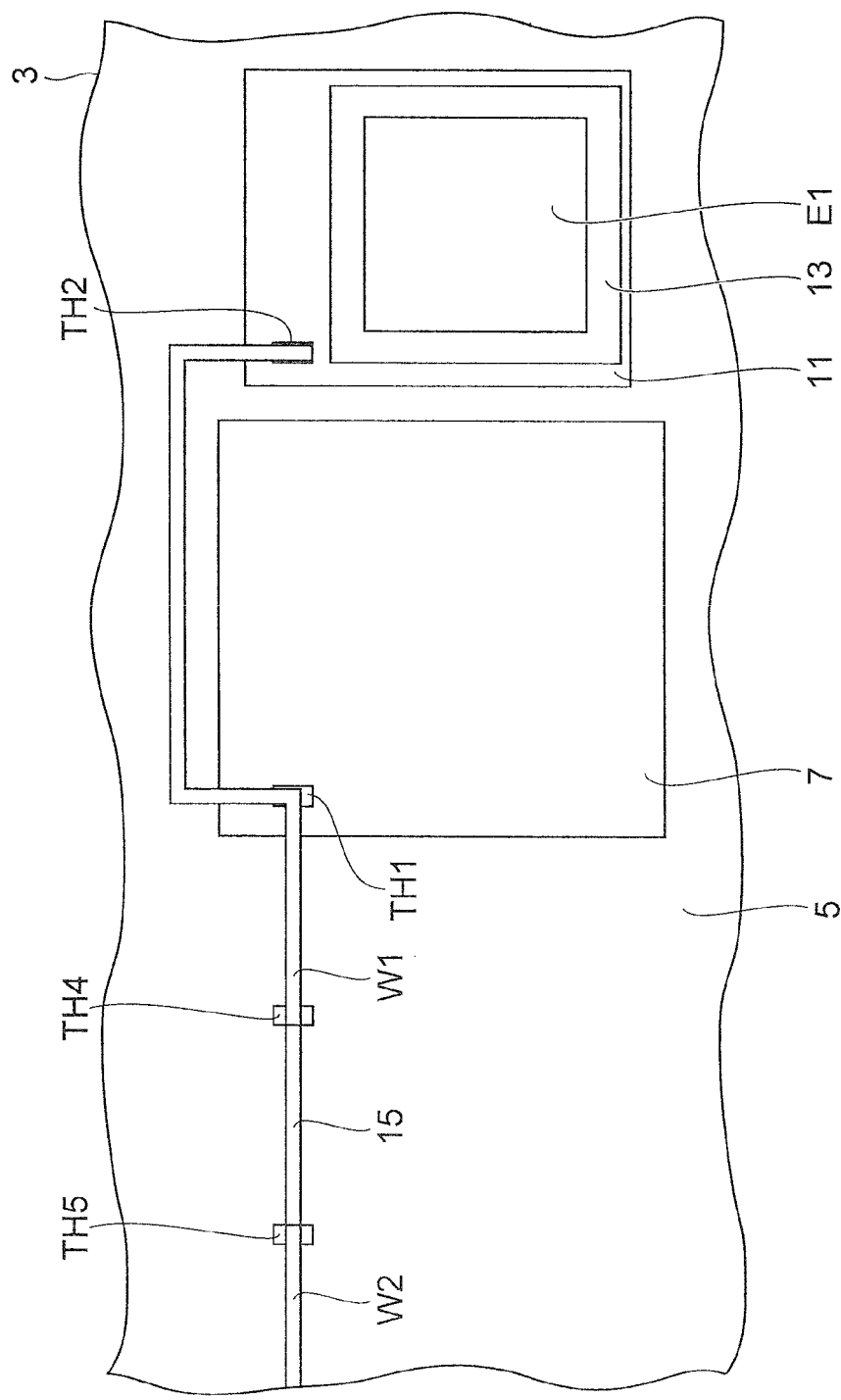
FIG. 4 is a schematic plan view showing a light detecting apparatus according to a comparative example.
Figure 5:
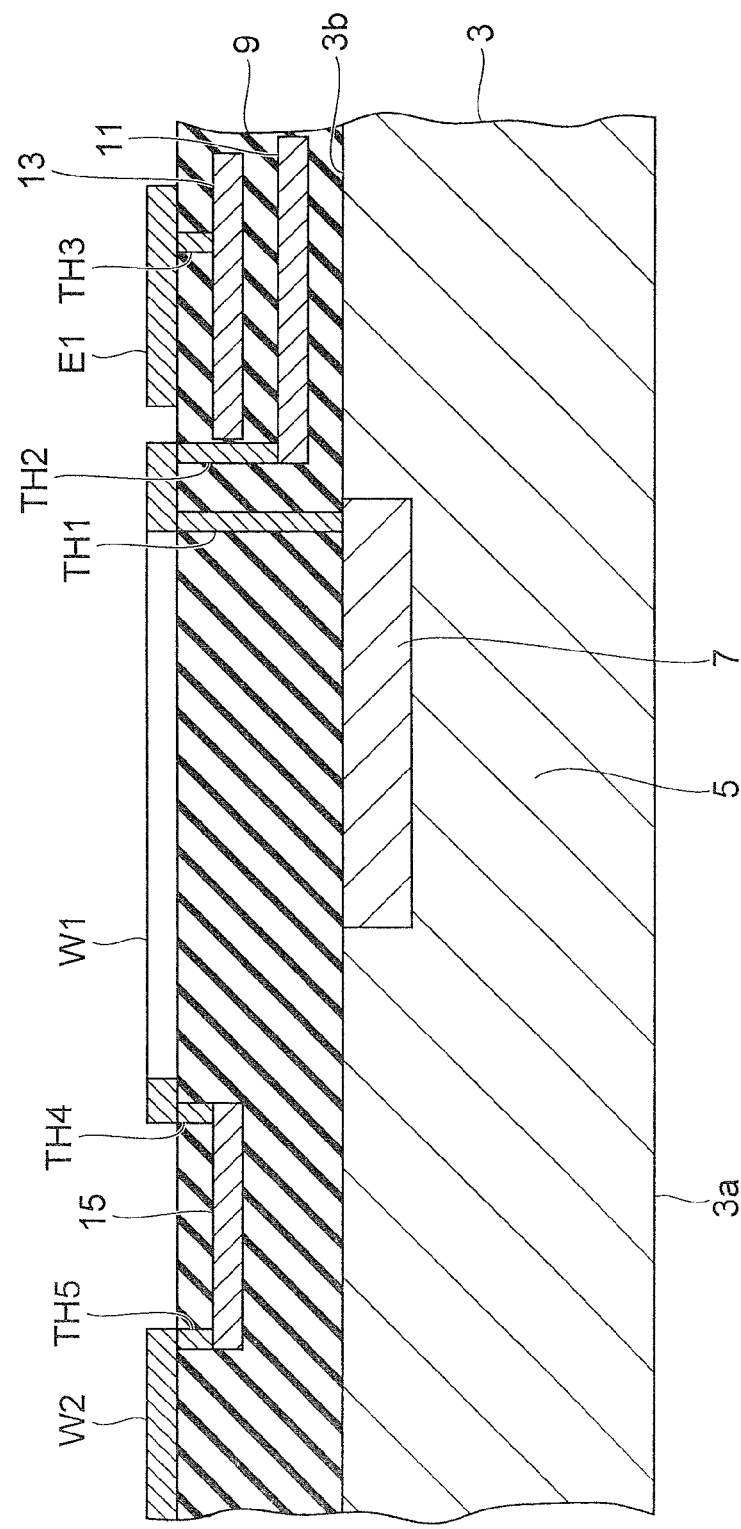
FIG. 5 is a drawing for explaining a cross-sectional configuration of the light detecting apparatus according to the comparative example.
Figure 6:
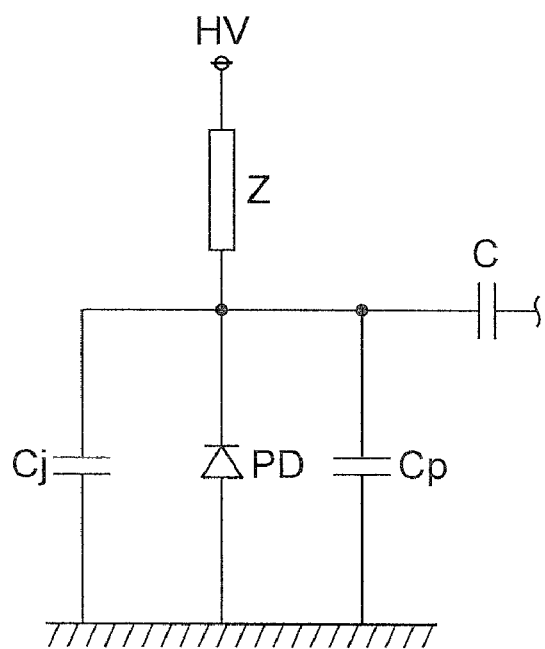
FIG. 6 is a circuit diagram showing an equivalent circuit of the light detecting apparatus according to the comparative example.

Incidentally, if the first electrode layer 11 is arranged above the first semiconductor region 5 so as to be opposed to the first semiconductor region 5 through the insulating layer 9 as shown in FIGS. 4 and 5, the following problem will arise. A parasitic capacitance Cp is generated between the first semiconductor region 5 and the first electrode layer 11 as shown in FIG. 6, and the parasitic capacitance Cp is connected in parallel to the junction capacitance Cj. This configuration increases the capacitance components connected in parallel to the photodiode PD. As a consequence of this, noise increases to reduce S/N ratios and deteriorate the high-frequency characteristic.

Figure 7:
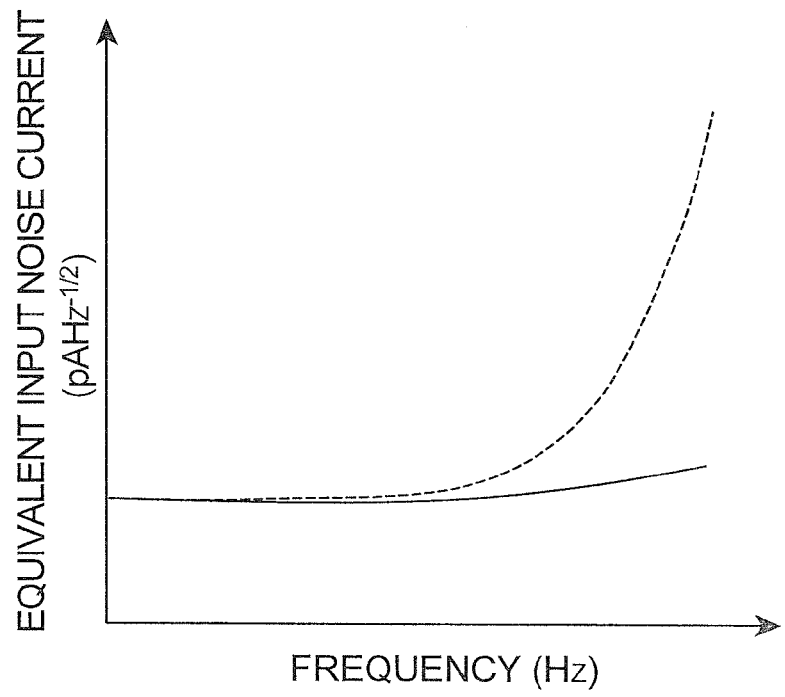
FIG. 7 is a graph showing a relation of frequency versus equivalent input noise current.

FIG. 7 is a graph showing a relation of frequency (Hz) versus equivalent input noise current (pAHz$^{-1/2}$). A solid line indicates the characteristic of the light detecting apparatus 1 shown in FIGS. 1 and 2, and a dashed line the characteristic of the light detecting apparatus shown in FIGS. 4 and 5. As seen from FIG. 7, the light detecting apparatus 1 of the present embodiment provides the excellent noise characteristic, while suppressing generation of parasitic capacitance.

Figure 8:
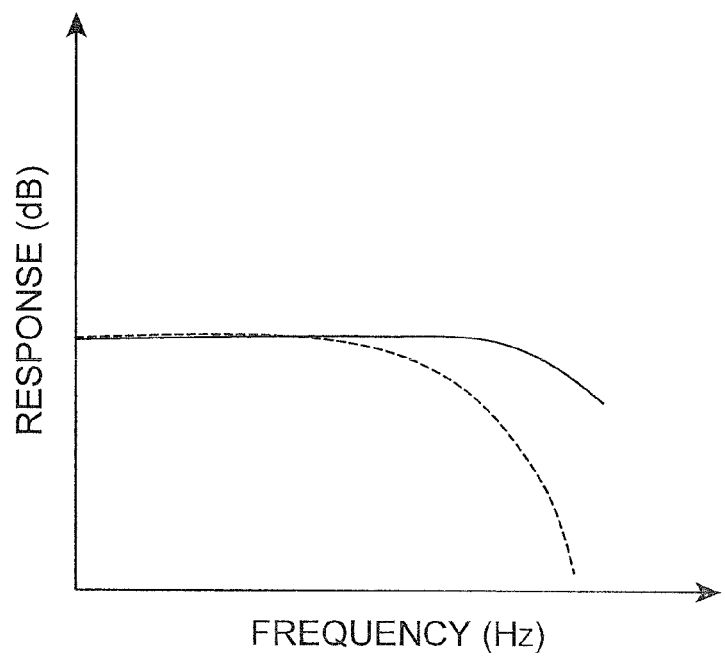
FIG. 8 is a graph showing a relation of frequency versus response.

FIG. 8 is a graph showing a relation of frequency (Hz) versus response (dB). A solid line indicates the characteristic of the light detecting apparatus 1 shown in FIGS. 1 and 2, and a dashed line the characteristic of the light detecting apparatus shown in FIGS. 4 and 5. As seen from FIG. 8, the light detecting apparatus 1 of the present embodiment provides the excellent high-frequency characteristic, while suppressing generation of parasitic capacitance, so as to achieve expansion of the band of the characteristic.

In the present embodiment, the first and second electrode layers 11, 13 are arranged on the second principal surface 3b side of the semiconductor substrate 3, thereby to form the coupling capacitor connected in series to the photodiode PD, so as to achieve downsizing of the configuration of the light detecting apparatus 1. Namely, there is no need for adopting a chip capacitor as a coupling capacitor and there is no need for use of a board or the like for mounting of the semiconductor substrate 3 and the chip capacitor, either. For this reason, the light detecting apparatus 1 of the present embodiment is free of the parasitic capacitance which could be generated if the light receiving element and chip capacitor are mounted on a board.

Figure 9:
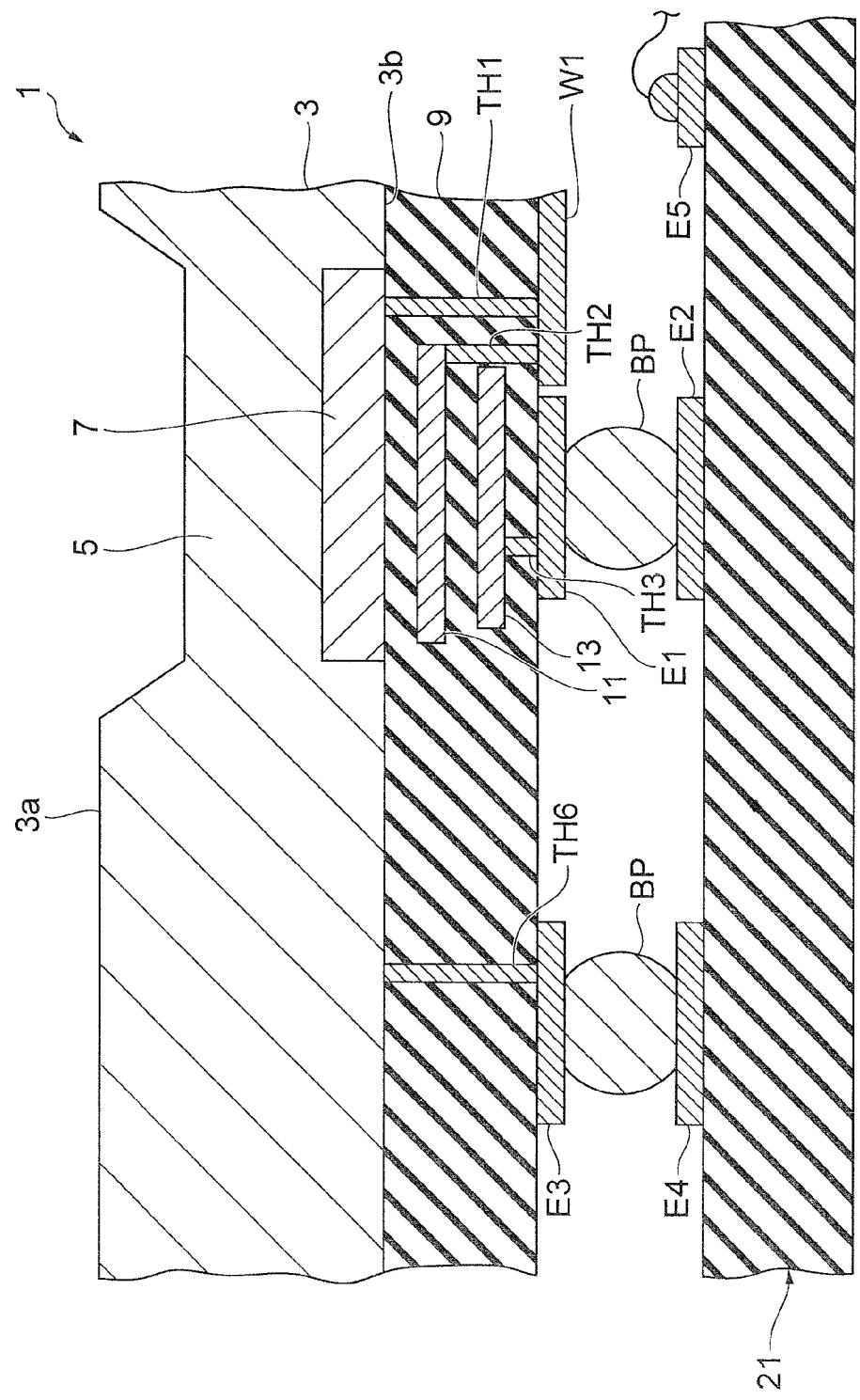
FIG. 9 is a drawing showing a configuration wherein a semiconductor substrate is mounted on a device.
Figure 10:
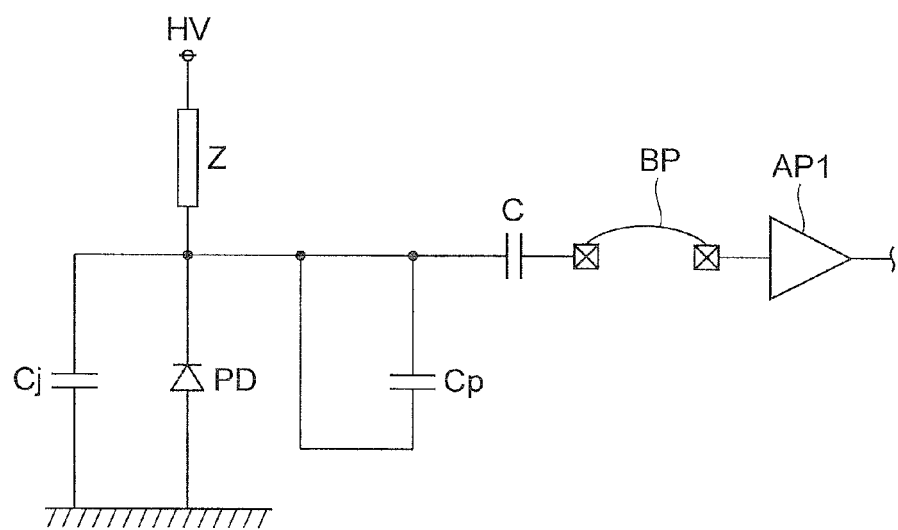
FIG. 10 is a circuit diagram showing an equivalent circuit including the device, in the light detecting apparatus according to the embodiment.

FIG. 9 is a drawing showing an example of mounting of the semiconductor substrate 3. As shown in FIG. 9, the semiconductor substrate 3 is mounted on a device 21 so that the second principal surface 3b is opposed to the device 21 through the insulating layer 9. The device 21 is provided with an amplifier AP1 as an amplifying means, as shown in FIG. 10.

The device 21 has a connection electrode E2 formed at a position where it is opposed to the connection electrode E1, in a principal surface facing the semiconductor substrate 3. The connection electrode E2 is electrically connected to an input terminal of the amplifier AP1. A connection electrode E4 is formed at a position where it is opposed to a connection electrode E3 electrically connected to the first semiconductor region 5 through a through-hole TH6, in the principal surface of the device 21 facing the semiconductor substrate 3. The connection electrode E4 is grounded.

The connection electrode E1 and the connection electrode E2 are electrically and physically connected through a bump BP and the connection electrode E3 and the connection electrode E4 are also electrically and physically connected through a bump BP. This connection results in electrically connecting the second electrode layer 13 and the input terminal of the amplifier AP1 through the bump BP. The device 21 is also provided with a connection electrode E5 for outputing a signal obtained by signal processing in the device 21, to the outside.

In this case, the first principal surface 3a of the semiconductor substrate 3 is the light entrance surface and the various electrodes including the connection electrodes E1, E3 do not impede incidence of light to the semiconductor substrate 3 (photodiode PD). Since the semiconductor substrate 3 and the device 21 are connected through the bumps BP, external noise is less likely to be mixed into the apparatus than in the configuration where they are connected by the technique such as wire bonding. As a result, it is feasible to suppress degradation of the noise characteristic. The above configuration is less likely to generate an unwanted parasitic capacitance than the configuration where the semiconductor substrate 3 and the device 21 are mounted on a board, and is thus able to prevent degradation of the noise and high-frequency characteristics.

In the present embodiment, the second electrode layer 13 and the connection electrode E1 are constructed as separate members. In this case, the electrode for constitution of the foregoing capacitance component C and the electrode for connection to the device 21 are separately constructed, whereby the second electrode layer 13 and the connection electrode E1 can be designed according to requirements suitable for the respective electrodes. For example, concerning the second electrode layer 13, the requirements include its plane size for setting the capacitance component C to a desired value, selection of a material with consideration to a forming process or the like, and so on. Concerning the connection electrode E1, the requirements include securement of connection strength to the device 21, selection of a material with consideration to a connection technique or the like, and so on.

Figure 11:
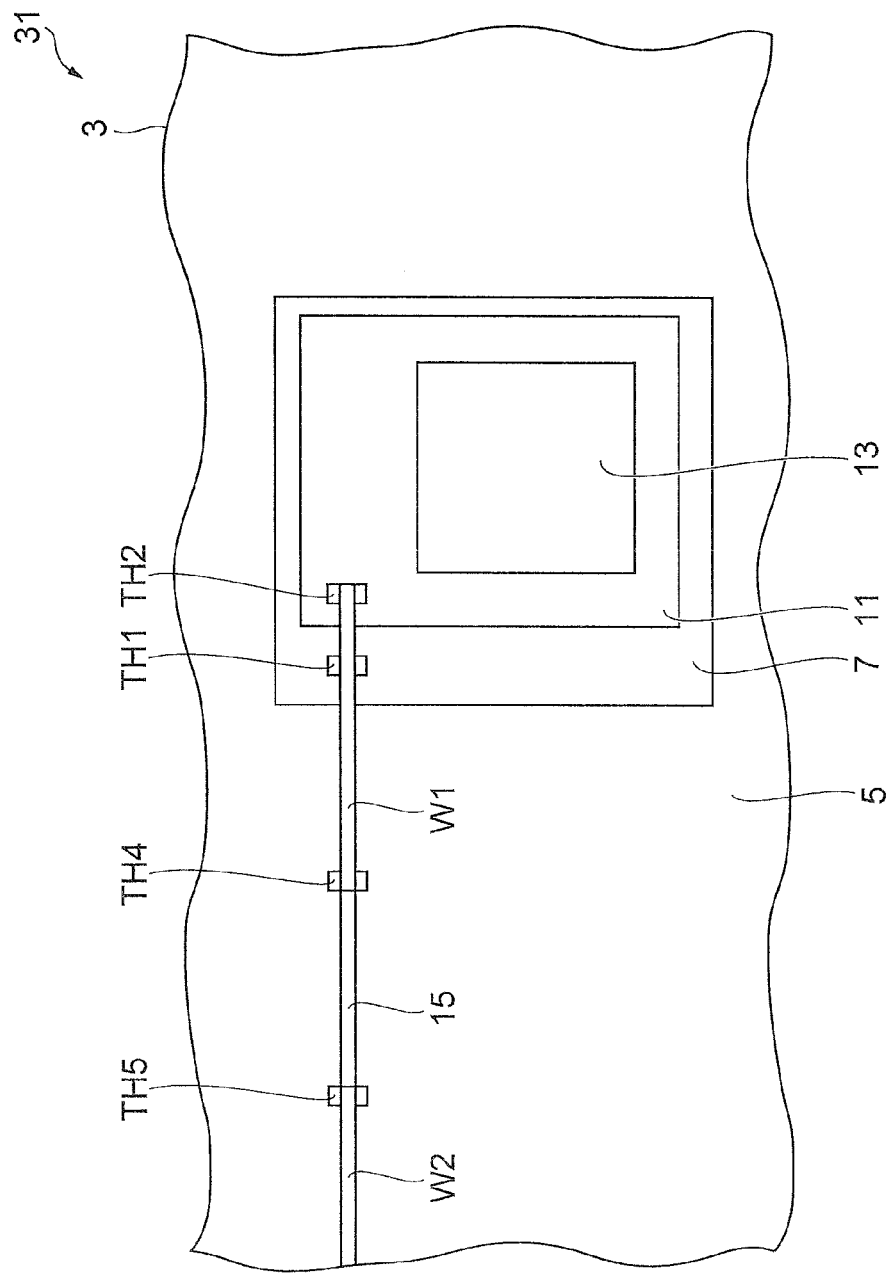
FIG. 11 is a schematic plan view showing a light detecting apparatus according to a modification example of the embodiment.
Figure 12:
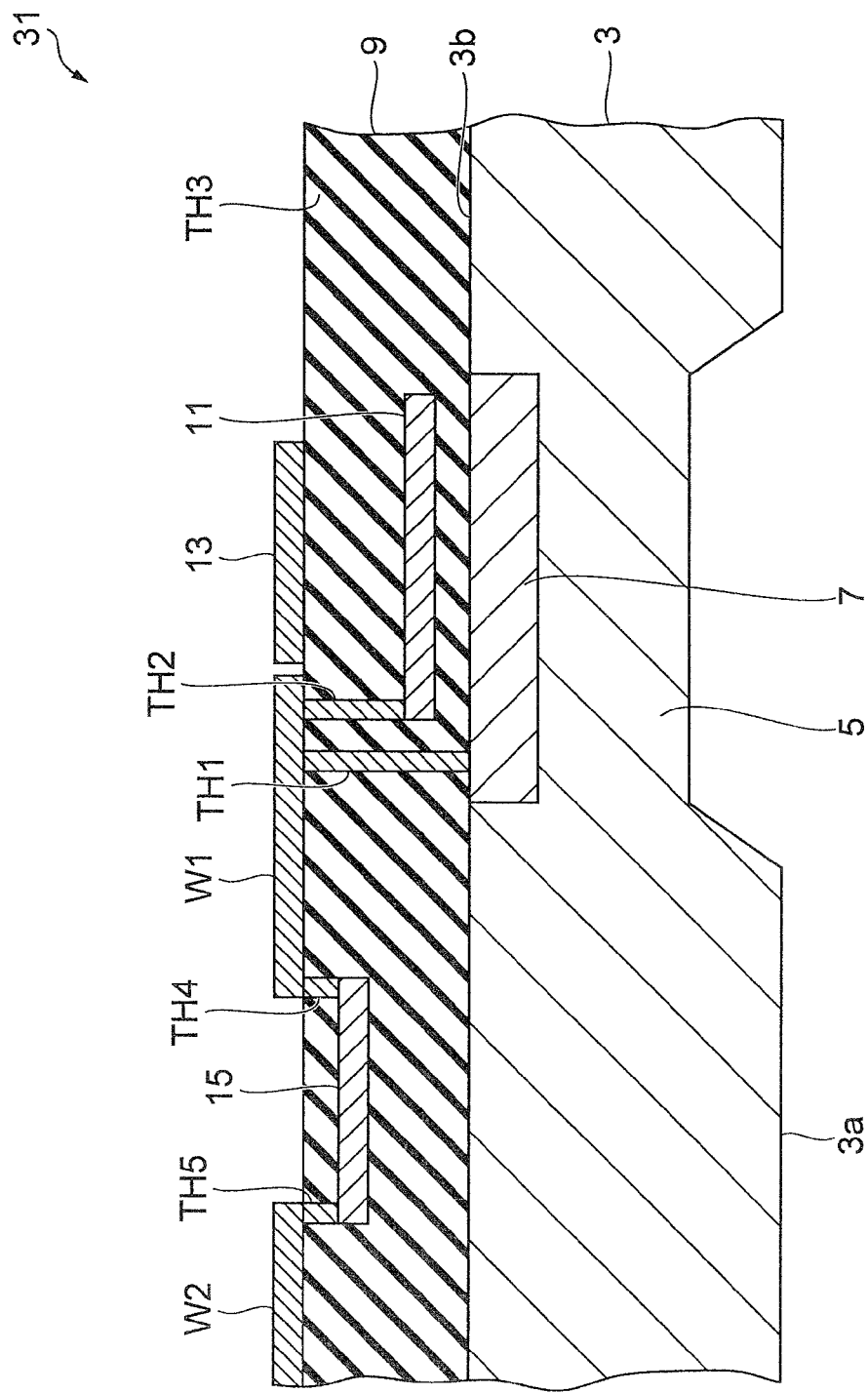
FIG. 12 is a drawing for explaining a cross-sectional configuration of the light detecting apparatus according to the modification example of the embodiment.

Another light detecting apparatus 31 according to a modification example of the present embodiment will be described below with reference to FIGS. 11 and 12. FIG. 11 is a schematic plan view showing the light detecting apparatus according to the modification example of the embodiment. FIG. 12 is a drawing for explaining a cross-sectional configuration of the light detecting apparatus according to the modification example of the embodiment. In FIG. 11 the apparatus is depicted without illustration of insulating layer 9 described later.

The light detecting apparatus 31, as shown in FIGS. 11 and 12, is provided with the semiconductor substrate 3 as the light detecting apparatus 1 is. The semiconductor substrate 3 has the first semiconductor region 5 and the second semiconductor region 7. The insulating layer 9 is formed on the second principal surface 3b of the semiconductor substrate 3. The first electrode layer 11, second electrode layer 13, and resistor 15 are arranged in or on the insulating layer 9.

The first electrode layer 11 is arranged above the second semiconductor region 7 so as to be opposed to the second semiconductor region 7 through the insulating layer 9. The first electrode layer 11 is electrically connected to the second semiconductor region 7 through the through-holes TH1, TH2 formed in the insulating layer 9 and through the wire W1 formed on the insulating layer 9.

The second electrode layer 13 is formed on the insulating layer 9 and arranged above the first electrode layer 11 so as to be opposed to the first electrode layer 11 through the insulating layer 9. In the present modification example, the second electrode layer 13 is comprised, for example, of metal such as aluminum (Al). The second electrode layer 13 also has the same function as the connection electrode E1 in the light detecting apparatus 1.

Since the first electrode layer 11 and the second electrode layer 13 are opposed to each other through the insulating layer 9, a capacitance component C is formed between the first electrode layer 11 and the second electrode layer 13, as shown in FIG. 3. The capacitance component C functions as a coupling capacitor connected in series to the photodiode PD. The parasitic capacitance Cp generated between the second semiconductor region 7 and the first electrode layer 11 is extremely small and substantially zero as described above.

From the above, the present modification example also substantializes the light detecting apparatus 31 with excellent noise and high-frequency characteristics, while suppressing generation of the parasitic capacitance Cp.

In the present modification example, the second electrode layer 13 is directly connected as a connection electrode to a bump BP. This allows the second electrode layer 13 to be used in common as an electrode for constitution of the capacitance component C and as an electrode for connection to the device 21, which can simplify the configuration of the light detecting apparatus 31.

Figure 13:
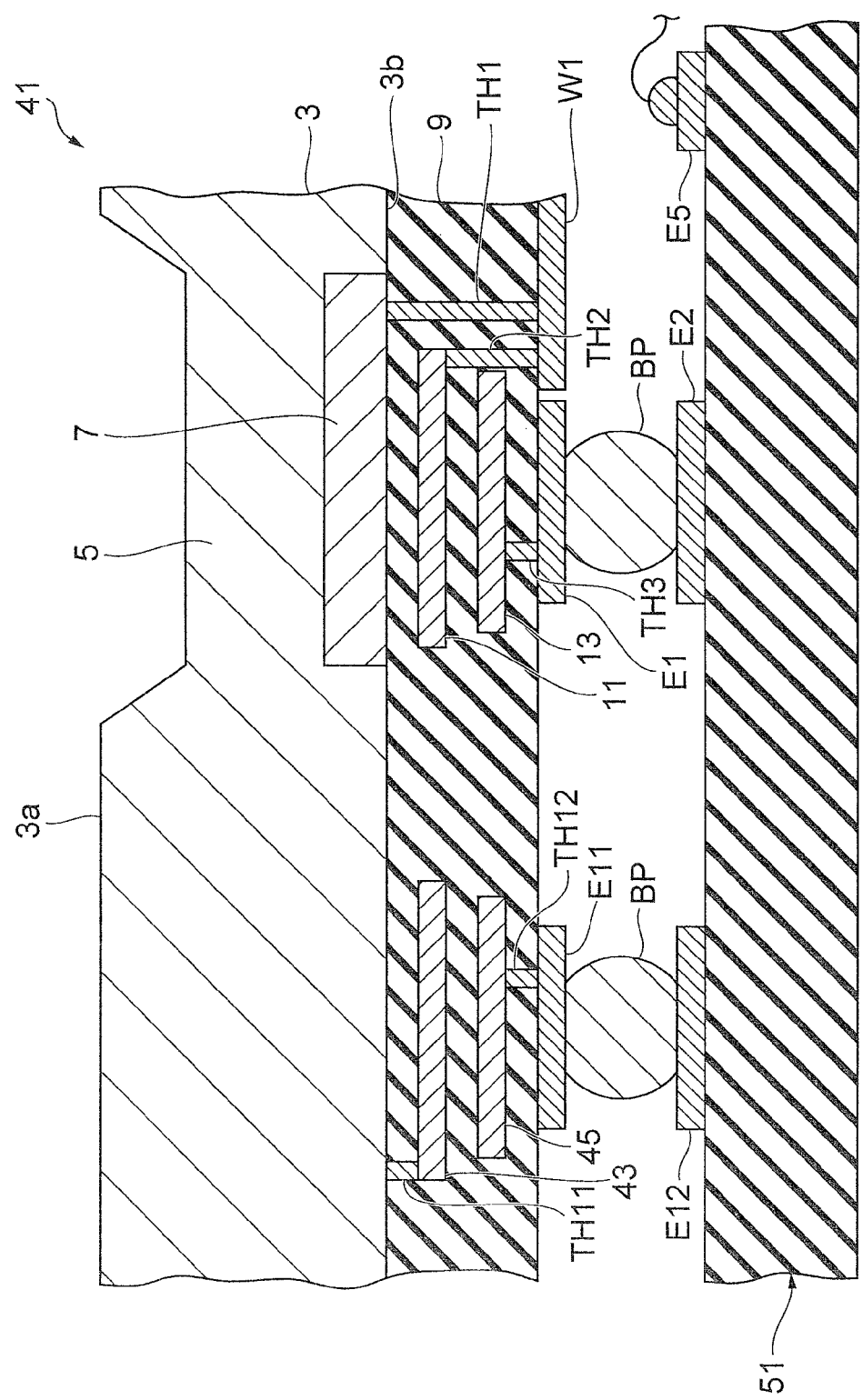
FIG. 13 is a drawing for explaining a cross-sectional configuration of a light detecting apparatus according to a further modification example of the embodiment.
Figure 14:
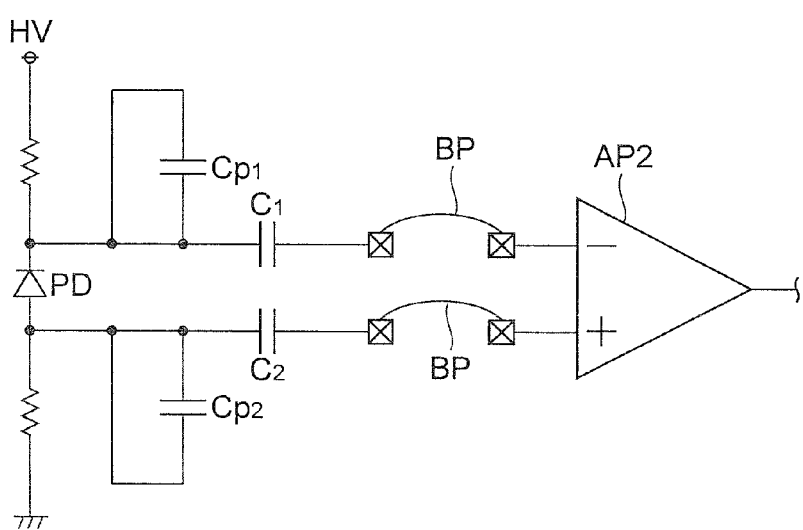
FIG. 14 is a circuit diagram showing an equivalent circuit of the light detecting apparatus according to the further modification example of the embodiment.

A light detecting apparatus 41 according to a further modification example of the embodiment will be described below with reference to FIGS. 13 and 14. FIG. 13 is a drawing for explaining a cross-sectional configuration of the light detecting apparatus according to the further modification example of the embodiment. FIG. 14 is a circuit diagram showing an equivalent circuit of the light detecting apparatus according to the further modification example of the embodiment.

The light detecting apparatus 41, as shown in FIG. 13, is provided with the semiconductor substrate 3 as the light detecting apparatus 1, 31 are. The semiconductor substrate 3 has the first semiconductor region 5 and the second semiconductor region 7. The insulating layer 9 is formed on the second principal surface 3b of the semiconductor substrate 3.

The first electrode layer 11 and the second electrode layer 13 are arranged in the insulating layer 9. Although not shown, resistors to constitute respective resistive components connected to the cathode and the anode of the photodiode PD are also arranged in the insulating layer 9.

The first electrode layer 11 is arranged above the second semiconductor region 7 so as to be opposed to the second semiconductor region 7 through the insulating layer 9. The first electrode layer 11 is electrically connected to the second semiconductor region 7 through the through-holes TH1, TH2 formed in the insulating layer 9 and through the wire W1.

The second electrode layer 13 is formed above the first electrode layer 11 so as to be opposed to the first electrode layer 11 through the insulating layer 9. The second electrode layer 13 is electrically connected to the connection electrode E1 formed on the insulating layer 9, through the through-hole TH3 formed in the insulating layer 9.

A third electrode layer 43 and a fourth electrode layer 45 are further arranged in the insulating layer 9. The third electrode layer 43 is arranged above the first semiconductor region 5 so as to be opposed to the first semiconductor region 5 through the insulating layer 9. The third electrode layer 43 is electrically connected to the first semiconductor region 5 through a through-hole TH11 formed in the insulating layer 9. The third electrode layer 43 has a rectangular shape on the plan view as the first electrode layer 11 does. The plane size of the third electrode layer 43 is, for example, 0.12 mm×0.12 mm. The third electrode layer 43 is comprised, for example, of polysilicon.

The fourth electrode layer 45 is arranged above the third electrode layer 43 so as to be opposed to the third electrode layer 43 through the insulating layer 9. The fourth electrode layer 45 has a rectangular shape on the plan view as the second electrode layer 13 does. The plane size of the fourth electrode layer 45 is, for example, 0.11 mm×0.11 mm. The fourth electrode layer 45 is wholly superimposed on the third electrode layer 43 when viewed from the direction perpendicular to the second principal surface 3b of the semiconductor substrate 3. The fourth electrode layer 45 is comprised, for example, of polysilicon. The fourth electrode layer 45 is electrically connected to a connection electrode E11 formed on the insulating layer 9, through a through-hole TH12 formed in the insulating layer 9. The through-hole TH12 is comprised, for example, of aluminum (Al). The connection electrode E11 has a rectangular shape on the plan view as the connection electrode E1 does. The plane size of the connection electrode E11 is, for example, 0.1 mm×0.1 mm. The connection electrode E11 is comprised, for example, of metal such as aluminum.

The semiconductor substrate 3 is mounted on a device 51 so that the second principal surface 3b is opposed to the device 51 through the insulating layer 9. The device 51, as shown in FIG. 14, is provided with an amplifier AP2 as an amplifying means.

The device 51 has connection electrodes E2, E12 formed on its principal surface facing the semiconductor substrate 3. The connection electrode E12 is arranged so as to be opposed to the connection electrode E11, on the principal surface facing the semiconductor substrate 3. The connection electrodes E2, E12 are electrically connected to respective input terminals of the amplifier AP2.

The connection electrodes E1 and E2 are electrically and physically connected through a bump BP and the connection electrodes E11 and E12 are also electrically and physically connected through a bump BP. This connection results in electrically connecting the second electrode layer 13 and the input terminal of the amplifier AP2 through the bump BP and electrically connecting the fourth electrode layer 45 and the input terminal of the amplifier AP2 through the bump BP.

Since the first electrode layer 11 and the second electrode layer 13 are opposed to each other through the insulating layer 9, a capacitance component $C_1$ is formed between the first electrode layer 11 and the second electrode layer 13 as shown in FIG. 14. Since the third electrode layer 43 and the fourth electrode layer 45 are opposed to each other through the insulating layer 9, a capacitance component $C_2$ is formed between the third electrode layer 43 and the fourth electrode layer 45. The capacitance components $C_1$, $C_2$ function as coupling capacitors connected in series to the photodiode PD.

Since the second semiconductor region 7 and the first electrode layer 11 are opposed to each other through the insulating layer 9, a parasitic capacitance $Cp_1$ is generated between the second semiconductor region 7 and the first electrode layer 11. However, as described above, the parasitic capacitance $Cp_1$ is extremely small and substantially zero.

Since the first semiconductor region 5 and the third electrode layer 43 are opposed to each other through the insulating layer 9, a parasitic capacitance $Cp_2$ is generated between the first semiconductor region 5 and the third electrode layer 43. However, the first semiconductor region 5 and the third electrode layer 43 are electrically connected through the through-hole TH11 and therefore a potential difference is unlikely to be made between the first semiconductor region 5 and the third electrode layer 43. Consequently, the parasitic capacitance $Cp_2$ is extremely small and substantially zero.

From the above, the present modification example also substantializes the light detecting apparatus 41 with excellent noise and high-frequency characteristics, while suppressing generation of the parasitic capacitances $Cp_1$, $Cp_2$.

Figure 15:
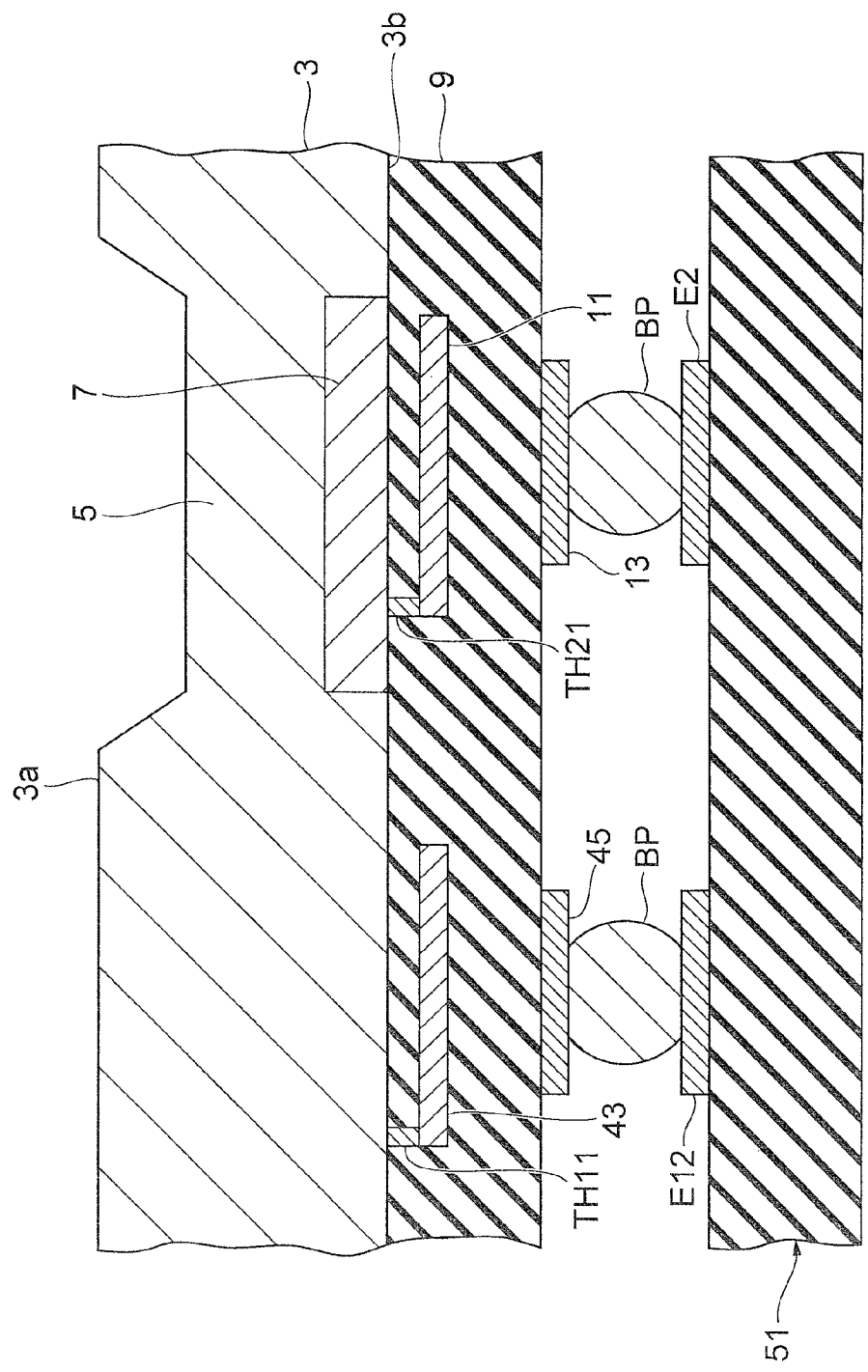
FIG. 15 is a drawing for explaining a cross-sectional configuration of a light detecting apparatus according to another modification example of the embodiment.

The second electrode layer 13 and the fourth electrode layer 45 may be formed on the insulating layer 9 as shown in FIG. 15, and in this case, the second electrode layer 13 and the fourth electrode layer 45 function as respective connection electrodes. The first electrode layer 11 may be electrically connected to the second semiconductor region 7 through a through-hole TH21.

The above described the preferred embodiments of the present invention, but it should be noted that the present invention is by no means limited to the above-described embodiments but can be modified in various ways without departing from the scope and spirit of the invention.

For example, the plane shapes of the second semiconductor region 7 and the first to fourth electrode layers 11, 13, 43, 45 do not have to be limited to the above-described rectangular shape, but may be any other shape such as a circular shape.

It is also possible to switch the conductivity types of p-type and n-type in the semiconductor substrate 3 to those opposite to the conductivity types described above.

The present invention is not limited only to the exemplified photodiode as the above embodiment, but the present invention is applicable to the light detecting apparatus with the semiconductor substrate to constitute the photodiode based on the pn junction, e.g., a photodiode array, an avalanche photodiode, an avalanche photodiode array, and so on.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light detecting apparatus comprising:
a semiconductor substrate having a first conductivity type first semiconductor region, and a second conductivity type second semiconductor region formed on the first semiconductor region and constituting a photodiode based on a pn junction formed between the first semiconductor region and the second semiconductor region;
a first electrode layer arranged above the second semiconductor region so as to be opposed to the second semiconductor region, and electrically connected to the second semiconductor region; and
a second electrode layer arranged above the first electrode layer so as to be opposed to the first electrode layer, and forming a capacitance component connected to the photodiode, between the first electrode layer and the second electrode layer,
wherein the semiconductor substrate includes first and second principal surfaces opposed to each other,
wherein the second semiconductor region is formed on the second principal surface side of the semiconductor substrate,
the light detecting apparatus further comprising a device arranged relative to the second principal surface of the semiconductor substrate and provided with amplifying means,
wherein the second electrode layer and an input terminal of the amplifying means are electrically connected to each other through a bump.

2. The light detecting apparatus according to claim 1,
wherein the second electrode layer is directly connected as a connection electrode to the bump.

3. The light detecting apparatus according to claim 1, further comprising:
a connection electrode electrically connected to the second electrode layer,
wherein the connection electrode and the bump are directly connected to each other.

4. A light detecting apparatus comprising:
a semiconductor substrate having a first conductivity type first semiconductor region, and a second conductivity type second semiconductor region formed on the first semiconductor region and constituting a photodiode based on a pn junction formed between the first semiconductor region and the second semiconductor region;
a first electrode layer arranged above the second semiconductor region so as to be opposed to the second semiconductor region, and electrically connected to the second semiconductor region; and
a second electrode layer arranged above the first electrode layer so as to be opposed to the first electrode layer, and forming a capacitance component connected to the photodiode, between the first electrode layer and the second electrode layer,
further comprising:
a third electrode layer arranged above the first semiconductor region so as to be opposed to the first semiconductor region, and electrically connected to the first semiconductor region; and
a fourth electrode layer arranged above the third electrode layer so as to be opposed to the third electrode layer, and forming a capacitance component connected to the photodiode, between the third electrode layer and the fourth electrode layer.

5. The light detecting apparatus according to claim 4,
wherein the semiconductor substrate includes first and second principal surfaces opposed to each other,
wherein the second semiconductor region is formed on the second principal surface side of the semiconductor substrate,
the light detecting apparatus further comprising a device arranged relative to the second principal surface of the semiconductor substrate and provided with amplifying means,
wherein the second and fourth electrode layers are electrically connected to respective input terminals of the amplifying means through respective bumps.

6. The light detecting apparatus according to claim 5,
wherein the fourth electrode layer is directly connected as a connection electrode to the bump.

7. The light detecting apparatus according to claim 5, further comprising:
a connection electrode electrically connected to the fourth electrode layer,
wherein the connection electrode and the bump are directly connected to each other.

* * * * *